(12) United States Patent
Kazama et al.

(10) Patent No.: US 7,832,091 B2
(45) Date of Patent: Nov. 16, 2010

(54) METHOD FOR MANUFACTURING CONDUCTIVE CONTACT HOLDER

(75) Inventors: Toshio Kazama, Nagano (JP); Shigeki Ishikawa, Nagano (JP)

(73) Assignee: NHK Spring Co., Ltd., Yokohama-shi (JP)

( * ) Notice: Subject to any disclaimer, the term of this patent is extended or adjusted under 35 U.S.C. 154(b) by 58 days.

(21) Appl. No.: 12/084,289

(22) PCT Filed: Oct. 27, 2006

(86) PCT No.: PCT/JP2006/321515

§ 371 (c)(1),
(2), (4) Date: Nov. 14, 2008

(87) PCT Pub. No.: WO2007/052558

PCT Pub. Date: May 10, 2007

(65) Prior Publication Data

US 2009/0151157 A1     Jun. 18, 2009

(30) Foreign Application Priority Data

Oct. 31, 2005 (JP) ............................. 2005-317699

(51) Int. Cl.
*H05K 3/00* (2006.01)
*G01R 31/02* (2006.01)

(52) U.S. Cl. .............................. 29/829; 29/825; 29/827; 29/830; 29/831; 29/832; 324/754

(58) Field of Classification Search .................... 29/829, 29/825, 830, 831, 832, 827; 324/754, 761, 324/762, 72.5, 755, 760; 439/482, 824; 174/262; 156/293

See application file for complete search history.

(56) References Cited

U.S. PATENT DOCUMENTS 5,160,779 A    11/1992    Sugihara (Continued)

FOREIGN PATENT DOCUMENTS

CN    1646923 A    7/2005

(Continued)

OTHER PUBLICATIONS

International Search Report, Jan. 5, 2007, issued in PCT/JP2006/321515.

(Continued)

*Primary Examiner*—Derris H Banks
*Assistant Examiner*—Tai Nguyen
(74) *Attorney, Agent, or Firm*—Edwards Angell Palmer & Dodge LLP

(57) ABSTRACT

A method for manufacturing a conductive contact holder includes forming, from a conductive material, a substrate having a hollow portion to which a holder member for holding a plurality of conductive contacts can be fitted; fixing the substrate formed from the conductive material and an insulating member by fitting the substrate and the insulating member into the hollow portion of the substrate, the insulating member being a raw material of the holder member; polishing a surface of the fixed holder member and a surface of the substrate adjoining the surface so as to make the surfaces smooth; and forming a plurality of holder holes for containing the conductive contacts, respectively, the holder holes penetrating the holder member, the surface of which is polished. The fixing includes filling an insulating adhesive between the holder member and the substrate.

3 Claims, 4 Drawing Sheets

U.S. PATENT DOCUMENTS

| | | | |
|---|---|---|---|
| 6,017,176 A * | 1/2000 | Marui | 411/82 |
| 6,114,864 A * | 9/2000 | Soejima et al. | 324/754 |
| 6,162,566 A * | 12/2000 | Amemiya | 430/5 |
| 7,239,158 B2 * | 7/2007 | Kazama et al. | 324/754 |
| 2004/0088855 A1 | 5/2004 | Akram | |
| 2004/0101666 A1 | 5/2004 | Tsubosaki et al. | |
| 2005/0088192 A1 | 4/2005 | Haga et al. | |
| 2005/0225313 A1 | 10/2005 | Kazama et al. | |
| 2005/0258843 A1 | 11/2005 | Kazama | |
| 2005/0266734 A1 | 12/2005 | Kazama | |

FOREIGN PATENT DOCUMENTS

| | | |
|---|---|---|
| EP | 0838685 A2 | 4/1998 |
| JP | 60-168062 | 8/1985 |
| JP | 3442137 | 8/1995 |
| JP | 3500105 | 8/2001 |
| JP | 2004-101410 | 4/2004 |
| TW | 492127 A | 6/2002 |
| TW | 1290626 B | 12/2007 |
| WO | WO-03/087852 | 10/2003 |

OTHER PUBLICATIONS

English specification of Taiwanese Patent Application No. 200305723.

Taiwanese Office Action dated Jun. 5, 2009, issued in TW95140142.

Office Action issued May 11, 2010 in the corresponding Chinese patent application.

Extended European Search Report in corresponding European Patent Application dated Jun. 14, 2010.

* cited by examiner

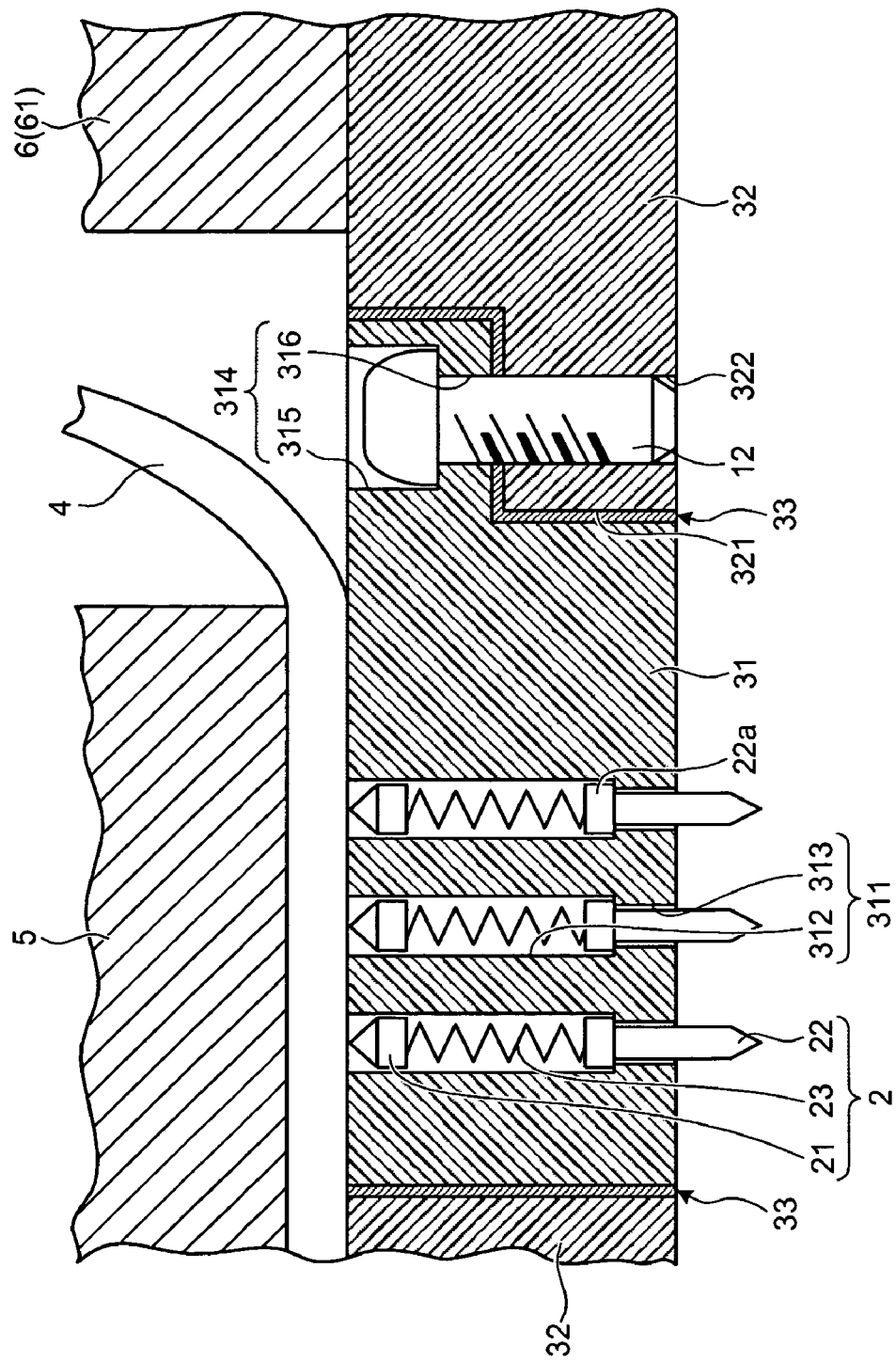

METHOD FOR MANUFACTURING CONDUCTIVE CONTACT HOLDER

CROSS REFERENCE TO RELATED APPLICATIONS

This application is related to co-pending application: "METHOD FOR MANUFACTURING CONDUCTIVE CONTACT HOLDER, AND CONDUCTIVE CONTACT HOLDER" filed on same date herewith in the name of Toshio KAZAMA and Shigeki ISHIKAWA as a national phase entry of PCT/JP2006/321514, which application is assigned to the assignee of the present application and is incorporated by reference herein.

BACKGROUND OF THE INVENTION

1. Field of the Invention

The present invention relates to a method for manufacturing a conductive contact holder that contains conductive contacts used for current testing of a circuitry such as a liquid crystal display.

2. Background Description of the Related Art

Conductive contacts (contact probes) having small diameters have been used in general to test electrical characteristics of test objects, such as liquid crystal displays (LCDs). A large number of terminals formed on a test object such as an LCD are arranged at small and narrow intervals, and conductive contacts are arranged in a conductive contact unit so as to correspond to a large number of terminals formed on the test object. Such a conductive contact unit having the above-described structure for making electrical connection with the test object has been employed (for example, see Patent Document 1).

To improve the position accuracy of conductive contacts contained in such a conductive contact holder while maintaining the strength of the conductive contact holder itself, a technology is disclosed that forms a holder member, made of a synthetic resin, as an integral unit with a metal plate incorporated therein (for example, see Patent Document 2).

Patent Document 1: Japanese Patent No. 3442137 Patent Document 2: Japanese Patent No. 3500105

SUMMARY OF THE INVENTION

To realize a conductive contact unit that deals with, for example, a circuitry driven at a high frequency, it is required to make a conductive contact have a total length shorter than the total length of a related-art conductive contact, and to make a conductive contact holder thin. With cast molding, insert molding, or other technologies, however, a thin conductive contact holder cannot be easily manufactured with its strength maintained.

To form a conductive contact holder as an integral unit by cast molding, insert molding, or other technologies, a long period of time (for example, about one week) is required before completion. Thus, the production has not been carried out quickly, thereby increasing production cost.

The present invention is made in view of the foregoing, and has an object to provide a method for manufacturing a conductive contact holder that is realized in a thin figure with its strength maintained, achieving reduction in production time and cost.

According to an aspect of the present invention, a method is for manufacturing a conductive contact holder, the conductive contact holder including an insulating holder member for holding a plurality of conductive contacts for inputting and outputting a signal to and from a circuitry, and a substrate having a hollow portion to which the holder member can be fitted. The method includes forming the substrate from a conductive material; fixing the substrate formed from the conductive material and an insulating member by fitting the substrate and the insulating member into the hollow portion of the substrate, the insulating member being a raw material of the holder member; polishing a surface of the fixed holder member and a surface of the substrate adjoining the surface so as to make the surfaces smooth; and forming a plurality of holder holes for containing the conductive contacts, the holder holes penetrating the holder member, the surface of which is polished. The fixing includes filling an insulating adhesive between the holder member and the substrate, or applying the adhesive either to an inner surface of the hollow portion before fitting the holder member or to a side surface facing the hollow portion of the holder member when fitting the holder member, or to the both surfaces.

In the method, the fixing may include fastening the holder member and the substrate with screws.

In the method, the forming may include forming an insulating layer on a surface of the substrate.

According to the method for manufacturing a conductive contact holder according to the present invention, a conductive contact holder is realized in a thin figure with its strength maintained, achieving reduction in production time and cost.

BRIEF DESCRIPTION OF DRAWINGS

FIG. 2 is a longitudinal cross sectional view showing relevant portions of the conductive contact holder manufactured by the conductive contact holder according to the embodiment of the present invention.

FIG. 4-1 is a cross sectional view showing that an adhesive is applied to a substrate by the method for manufacturing a conductive contact holder according to the embodiment of the present invention.

FIG. 4-2 is a cross sectional view showing that an insulating member is fitted to the substrate with screws screwed in by the method for manufacturing a conductive contact holder according to the embodiment of the present invention.

FIG. 4-3 is a cross sectional view showing that surfaces of the substrate and the insulating member are polished so that their through-thicknesses are equalized by the method for manufacturing a conductive contact holder according to the embodiment of the present invention.

FIG. 4-4 is a cross sectional view showing that holder holes are formed in the insulating member by the method for manufacturing a conductive contact holder according to the embodiment of the present invention.

EXPLANATIONS OF LETTERS OR NUMERALS

Figure 1:
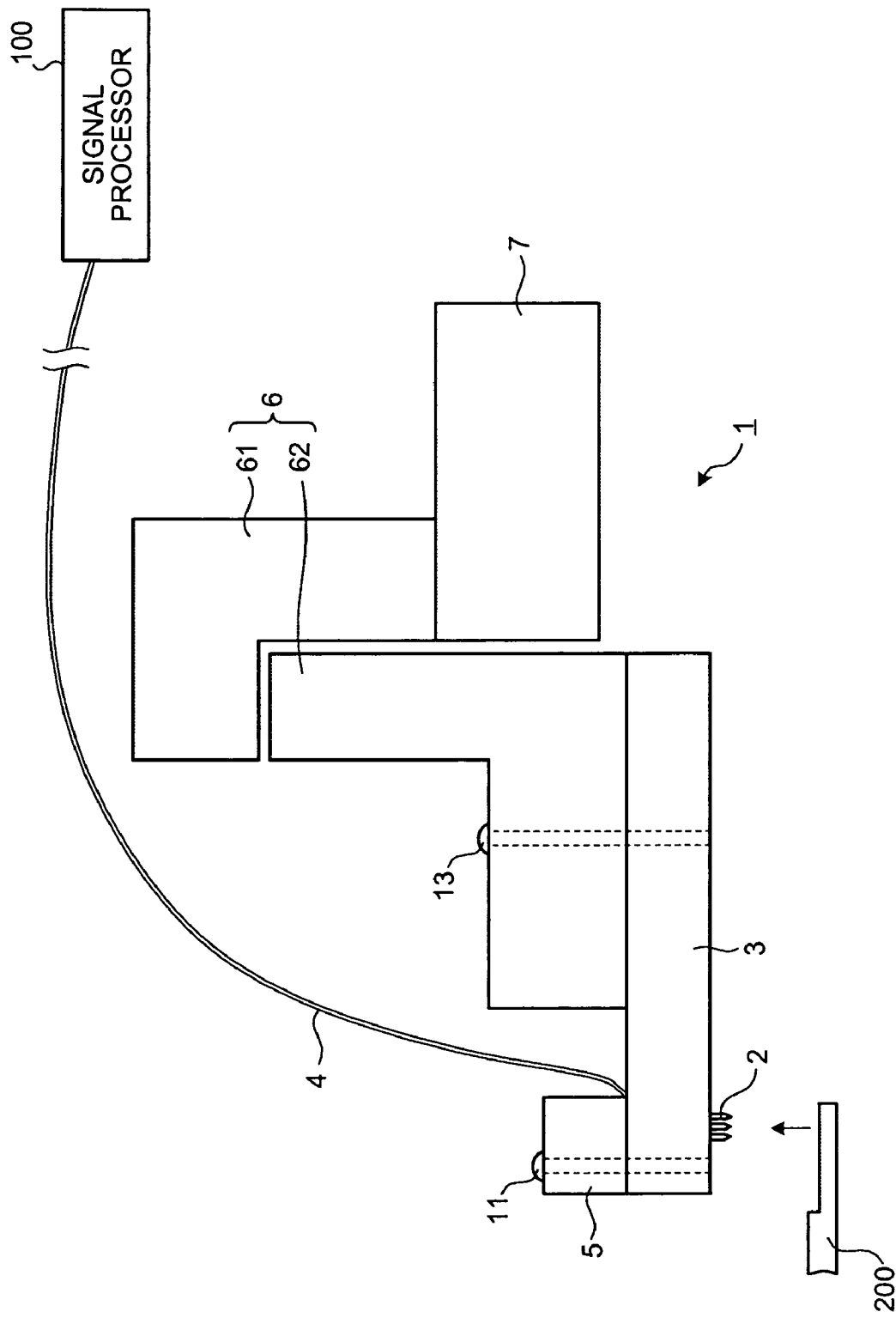
FIG. 1 is a schematic of a conductive contact unit that includes a conductive contact holder manufactured by a method for manufacturing a conductive contact holder according to an embodiment of the present invention.

1 Conductive contact unit
2 Conductive contact
3 Conductive contact holder
4 Wiring substrate
5 Fixing member
6 Adjustment mechanism 7 Frame substrate
11, 12, 13 Screw
21, 22 Needle member
22a Flange
23 Spring member
30 Insulating member
31 Holder member
32 Substrate
33 Adhesive
61 First block member
62 Second block member
100 Signal processor
200 Liquid crystal display
311 Holder hole
312, 315 Large diameter section
313, 316 Small diameter section
314, 322, 323, 324 Screw hole
321 Hollow portion

DETAILED DESCRIPTION OF EXEMPLARY EMBODIMENTS

Exemplary embodiments (hereinafter, "embodiments") for carrying out the present invention will be described below with reference to the accompanying drawings. Note that the drawings are schematics and the relationship between the thickness and the width of elements, the ratio of the thicknesses of the elements, and the like may be different from those actually measured. Needless to say, some elements may be different between figures regarding the dimensional relationship or ratio.

FIG. 1 is a schematic of a conductive contact unit that includes a conductive contact holder formed by a method for manufacturing a conductive contact holder according to an embodiment of the present invention. A conductive contact unit 1 shown in FIG. 1 is used for final inspection (lighting test, array substrate test, or the like) of a test object, i.e., an LCD 200. The conductive contact unit 1 includes: a plurality of conductive contacts 2 that are arranged corresponding to a wiring pattern, provided in the LCD 200, for inputting and outputting signals, and that transmit and receive signals between the LCD 200 and a signal processor 100 that generates testing electrical signals and also inputs and outputs electrical signals from the test object; a conductive contact holder 3 that contains and holds the conductive contacts 2; a wiring substrate 4 that provides electrical connection between the conductive contacts 2 and the signal processor 100 that generates and outputs testing signals; a fixing member 5 that fixes one end of the wiring substrate 4 to the conductive contact unit 1; an adjustment mechanism 6 that adjusts the height position of the conductive contacts 2; and a frame substrate 7 that holds the adjustment mechanism 6.

Figure 3:
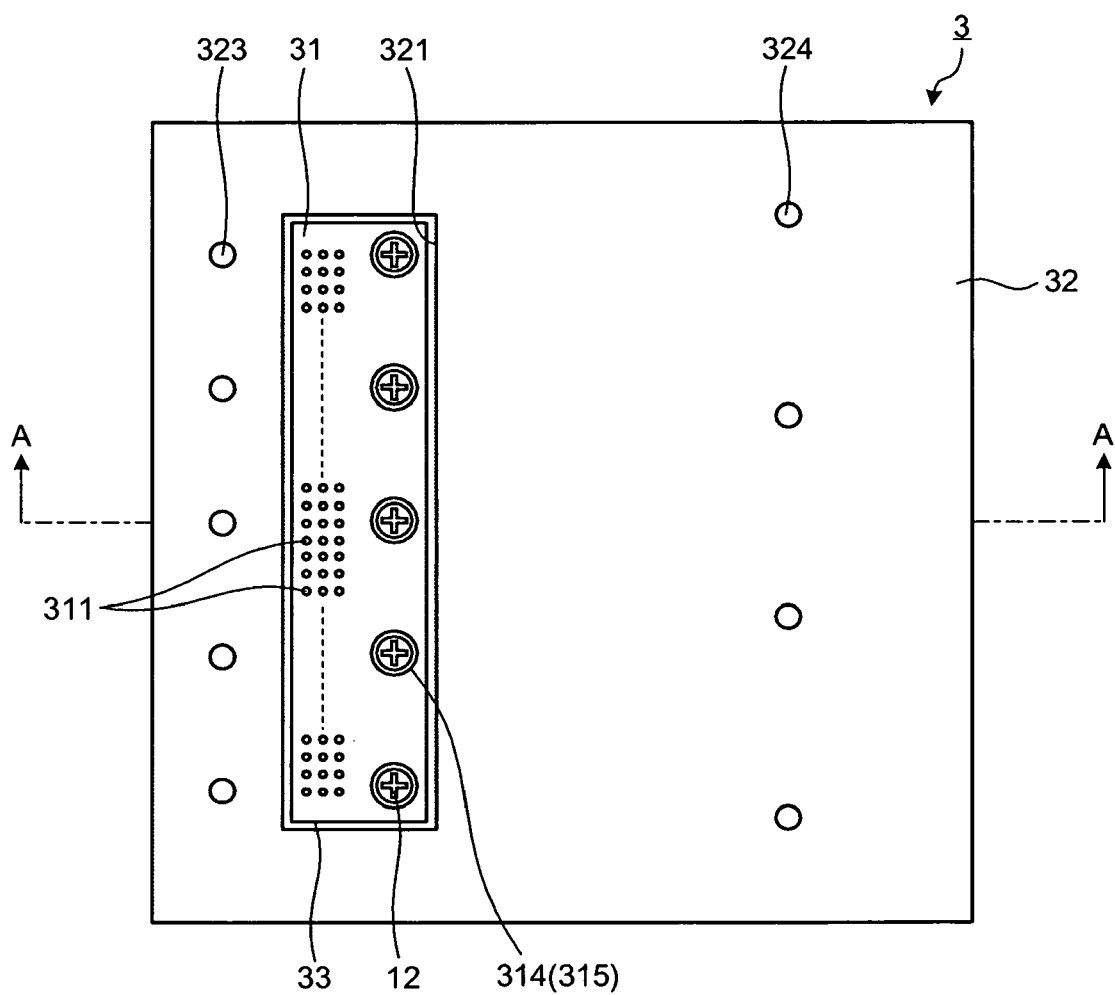
FIG. 3 is a top view showing the relevant portions of the conductive contact holder manufactured by manufacturing the conductive contact holder according to the embodiment of the present invention.
Figures 1, 4:
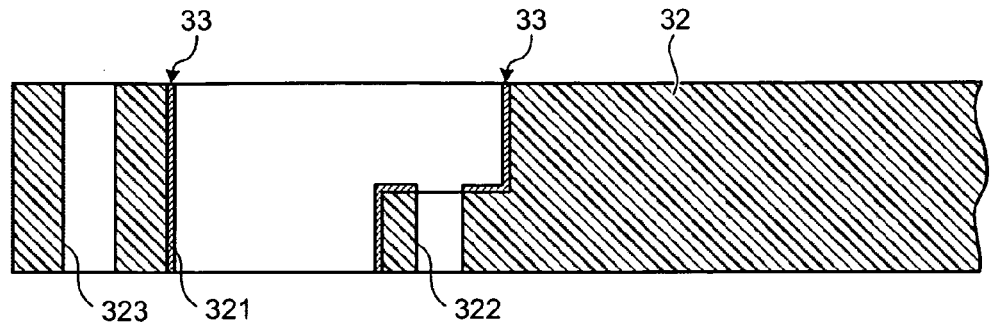
Figures 2, 4:
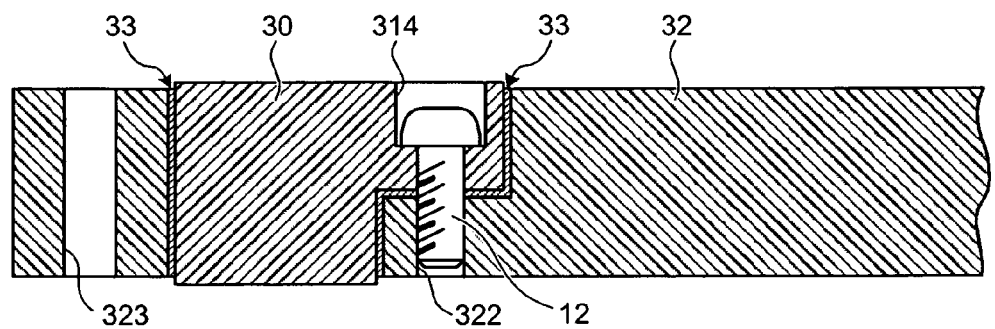
Figures 3, 4:
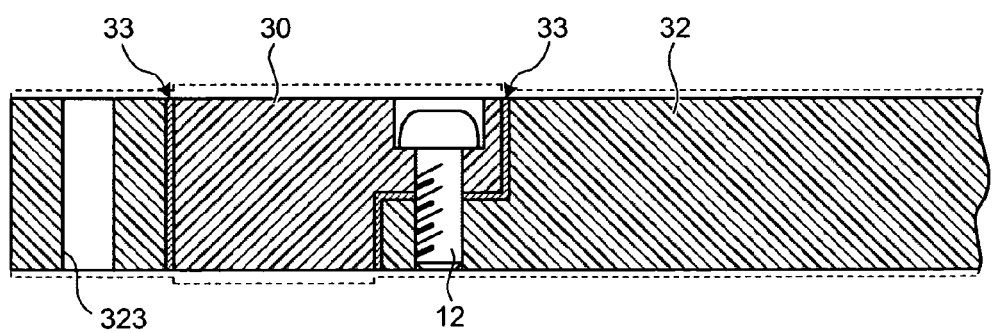
Figure 4:
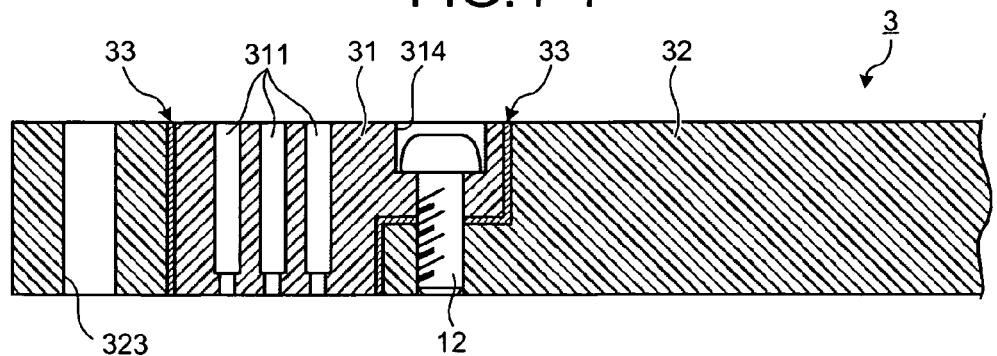

FIG. 2 is a longitudinal cross sectional view of relevant portions of the conductive contact holder 3 that contains the conductive contacts 2, and FIG. 3 is a top view of the conductive contact holder 3. The conductive contact holder 3 shown in FIGS. 2 and 3 includes a holder member 31 that contains the conductive contacts 2, and a substrate 32 that holds the holder member 31 fitted to a slot-like hollow portion 321.

The holder member 31 is formed with a highly insulating synthetic resin or the like, and has a volume capable of containing about hundreds or thousands of the conductive contacts 2. In the holder member 31 are formed holder holes 311 for containing the conductive contacts 2. The holder holes 311 are arranged corresponding to a wiring pattern on an LCD to contain the conductive contacts 2. Each of the holder holes 311 includes a large diameter section 312, and a small diameter section 313 having a diameter smaller than that of the large diameter section 312. Thus, each of the holder holes 311 is formed of a stepped hole with their both ends constituting opening surfaces of the holder member 31 and having different diameters.

The substrate 32 has high strength and durability, and is made of a conductive material having a small thermal expansion coefficient. The substrate 32 includes a hollow portion 321 to which the holder member 31 can be fitted. The substrate 32 further includes: a plurality of screw holes 322 in which screws 12 for fastening the holder member 31 and the substrate 32 are screwed; a plurality of screw holes 323 in which screws 11 for fastening the fixing member 5 and the substrate 32 are screwed; and a plurality of screw holes 324 in which screws 13 for fastening the adjustment mechanism 6 and the substrate 32 are screwed. For the conductive material, for example, low-thermal expansion metal, such as invar or Koval®, semiconductor, ceramic, or glass may be used.

The substrate 32 having the above-described structure has the function for improving the strength of the conductive contact holder 3, and also a function for shielding electromagnetic waves. This function prevents electromagnetic waves produced and radiated when an electrical signal passes through the conductive contact 2 and externally transmitted electromagnetic waves from reaching the other conductive contacts 2. Because each of the conductive contacts 2 is of negligible size for the substrate 32, almost no change occurs in potential of the substrate 32 due to the electrical charges given from the conductive contacts 2, allowing the potential to be stably maintained at 0. For the substrate 32 to fully exhibit such functions for shielding the electromagnetic waves or for stably maintaining the zero potential, it is preferable that the conductive material constituting the substrate 32 have a volume resistivity of 1 μΩ·cm to 100 μΩ·cm.

In a space along an interface between the holder member 31 and the substrate 32 is applied or filled a highly insulating adhesive 33. By using an epoxy-based adhesive or a cyanoacrylate-based (instant) adhesive for the adhesive 33, a synthetic resin or the like constituting the holder member 31 is suitably prevented from expansion even under the temperature (not less than 50° C.) requiring consideration for thermal expansion of the synthetic resin or the like.

The holder member 31 and the substrate 32 are bonded with the adhesive 33, and also fastened with the screws 12. When metal is used as a conductive material constituting the substrate 32, the screws holes 322 are formed in that metal. This increases clamping capacity with the screws 12, allowing the holder member 31 to be stably held on the substrate 32. Further, even by repeatedly attaching and detaching the screws 12, the screw threads of the substrate 32 are not easily damaged, improving maintenance and durability.

Referring to FIG. 2, the following describes a structure of the conductive contacts 2. Each of the conductive contacts 2 is formed of a conductive member, and includes a needle member 21 that comes in contact with the wiring substrate 4; a needle member 22 that comes in contact with a connecting terminal (not shown) on the LCD 200; and a spring member 23 that resides between the needle members 21 and 22, and extends and contracts so as to connect the two needle members 21 and 22. The needle members 21 and 22 and the spring members 23, each set of which constitute the same conductive contact 2, share the same axis line and penetrate each holder hole 311 formed in the conductive contact holder 3.

Each of the needle members 21 has: a tip end that comes in contact with a terminal section of the wiring substrate 4; and a cylindrical body positioned on a base end side of the tip end and having the same diameter as that of a circle of the base end. The needle member 21 can be moved in an axial direction due to the expansion and contraction behavior of the spring member 23. Further, the needle member 21 is urged to get snapping in a direction toward the wiring substrate 4 due to the elastic force of the spring member 23.

On the contrary, each of the needle members 22 has a tip end that comes in contact with a connecting terminal formed on the LCD 200. The needle member 22 can be moved in the axial direction due to the expansion and contraction behavior of the spring member 23. Further, the needle member 22 is urged to get snapping in an electrode direction due to the elastic force of the spring member 23. On the needle member 22 is provided a flange 22a that comes in contact with a stepped portion of the holder hole 311 in the holder member 31, i.e., an interface between the large diameter section 312 and the small diameter section 313, thereby serving to retain the conductive contact 2 inside the holder member 31.

Each of the spring members 23 has one end that comes in contact with a bottom surface of the body of the needle member 21, and the other end that comes in contact with the flange 22a of the needle member 22. The needle members 21 and 22 and the spring member 23 are coupled by either the winding force of the spring or soldering, or by both.

The wiring substrate 4 provides electrical connection between the conductive contacts 2 and the signal processor 100. The wiring substrate 4 has one end fixed on a surface of the fixing member 5 that faces the conductive contact holder 3. On a lower surface of the one end in FIG. 1 are arranged terminal sections (not shown) corresponding to the positions of the tip ends of the needle members 21. As shown in FIG. 2, the opening surface at the upper ends of the large diameter sections 312 of the holder holes 311 are covered with the wiring substrate 4, and the terminal sections on the surface of the wiring substrate 4 are in contact with the tip ends of the needle members 21. In this state, by setting, for example, the length of the large diameter sections 312 to compress the spring members 23, the needle members 21 can be reliably brought into contact with the terminal sections on the wiring substrate 4 by a predetermined pressing force. The electrical connections between the conductive contacts 2 and the wiring substrate 4 may be made by their physical contact. Alternatively, for example, terminals corresponding to the conductive contacts 2 may be formed on a lower surface of the fixing member 5 so as to make electrical connections with the wiring substrate 4 via the terminals.

In the wiring substrate 4, electrical connections are provided between the numerous conductive contacts 2 and the signal processor 100 by, for example, flexible printed circuit (FPC), tape automated bonding (TAB), or other technologies. The wiring substrate 4 may be formed by numerous conductive wires or the like corresponding to the numerous conductive contacts 2.

In the substrate 32 are formed the screw holes 323, in which the screws 11 for fixing the fixing member 5 on the conductive contact holder 3 are screwed. This arrangement enables the fixing member 5 to be securely attached as in the holder member 31. As a result, by only pinching the wiring substrate 4 as described, the wiring substrate 4 can be securely fixed. It is preferable that the fixing member 5 be made of a synthetic resin because the elastic deformability of the synthetic resin can be used to press the wiring substrate 4 to get snapping, enabling to fix the wiring substrate 4 without making any damage on it.

The adjustment mechanism 6 includes a first block member 61 that is fixed to the frame substrate 7, and a second block member 62 that is fixed to the conductive contact holder 3 with the screws 13. The adjustment mechanism 6 serves to adjust the vertical positional relationship between the first block member 61 and the second block member 62, and to adjust the height of the conductive contact holder 3 relative to the frame substrate 7 (the position in the vertically up-and-down direction in FIG. 1).

When the conductive contact unit 1 having the above-described structure is used, the conductive contacts 2 are aligned in a lateral direction in FIG. 1 such that the conductive contacts 2 are positioned vertically upward corresponding to terminals (panel terminals) on the LCD 200.

For example, upon completion of lateral alignment by slightly adjusting the position of the frame substrate 7 in the lateral direction, the vertical positional relationship between the conductive contacts 2 and the LCD 200 is adjusted, so that the conductive contacts 2 and the panel terminals are brought into physical contact with each other. In this case, the panel terminals are brought into contact with the conductive contacts 2 by moving the LCD 200 in the vertically upward direction in FIG. 1. The physical contact is preferably made such that a predetermined pressing force is applied from one side to the other side to make contact with each other. This is because bringing the conductive contacts 2 into contact with the panel terminals with application of a pressing force enables to reduce electrical contact resistance between the conductive contacts 2 and the panel terminals.

After adjustment of the vertical positional relationship between the conductive contacts 2 and the LCD 200, the signal processor 100 outputs to the LCD 200 a testing electrical signal. Specifically, an electrical signal generated and output by the signal processor 100 is input to the LCD 200 via the wiring substrate 4, the conductive contacts 2, and the panel terminals on the LCD 200. The electrical signal is processed in an electrical circuit (not shown) provided in the LCD 200, and a response signal is output from the LCD 200 to the signal processor 100. The signal processor 100 performs processing using the response signal received from the LCD 200 via the conductive contacts 2 and the wiring substrate 4, so as to determine, for example, whether the LCD 200 has desirable characteristics.

Referring to FIGS. 4-1 to 4-4, the following describes a method for manufacturing a conductive contact holder according to the present embodiment. The slot-like hollow portion 321 to which the holder member 31 is fitted, and the screw holes 323, 322, and 324 in which the screws 11, 12, and 13 are screwed are formed at predetermined positions on the plate-like substrate 32. To form the hollow portion 321 and the screw holes 322 to 324, the substrate 32 needs to be processed by etching, laser, press, or other appropriate processing. Then, the insulating adhesive 33 is applied to an inner surface of the hollow portion 321. FIG. 4-1 is a cross sectional view taken along the same plane as in FIG. 2, showing that the hollow portion 321 and the screw holes 322 to 324 are formed on the substrate 32 with the adhesive applied to the inner surface of the hollow portion 321 (the screw holes 324 are not shown).

Then, to the hollow portion 321 in the substrate 32, an insulating member 30 is fitted that eventually constitutes the holder member 31. The insulating member 30 has a shape to be fitted to the hollow portion 321. Further, the insulating member 30 has screw holes 314 formed in advance and sharing the same axes with the corresponding screw holes 322 in the substrate 32 when fitted to the substrate 32. As shown in FIG. 2, each of the screw holes 314 is formed of a stepped hole, including: a large diameter section 315 in which the head of the screw 12 can be inserted; and a small diameter section 316 that has a screw thread formed thereon to provide engagement with the thread portion of the screw 12, and that has the same diameter as that of the screw hole 322 in the substrate 32. The insulating member 30 having such a shape is formed by etching or blanking, or processing using laser, electron beam, ion beam, wire electrical discharge, or the like.

FIG. 4-2 depicts that the insulating member 30 and the substrate 32 are fastened to each other by fitting the insulating member 30 formed as such to the hollow portion 321 in the substrate 32, and then by screwing the screw 12 in the screw holes 314 and 322. In this state, the insulating member 30 is bonded to the inner surface of the hollow portion 321 with the adhesive 33, and fastened to the substrate 32 with the screw 12. The adhesive 33 may be filled, after the insulating member 30 is fitted to the hollow portion 321, into the space between the hollow portion 321 and the insulating member 30. The insulating member 30 and the substrate 32 may be fastened to each other only with the adhesive 33, without using the screws 12.

To achieve an assembly shown in FIG. 4-2, positioning holes are made on predetermined positions at the insulating member 30 and the substrate 32 so as to penetrate the both members coaxially. Then, when the insulating member 30 is fitted to the hollow portion 321 of the substrate 32, the both members are aligned by inserting a positioning pin in each of the positioning holes.

In the arrangement shown in FIG. 4-2, the through thickness of the insulating member 30 (the thickness in the vertical direction in FIG. 4-2) is different from the through thickness of the substrate 32, causing a level difference between the boundary surfaces of the both members. Such a level difference may affect the accuracy of testing when making contact with the LCD 200. Thus, in the present embodiment, the insulating member 30 and the substrate 32 are made to have the same through thickness. Further, regarding the through-thickness direction as normal line, both the upper and the lower surfaces of the both members are polished (surface polishing process) so that the boundary surfaces of the both members constitute a continued smooth surface. As a result, the insulating member 30 and the substrate 32 have the same through thickness as shown in FIG. 4-3. The surface polishing process specifically includes milling or lapping.

Thereafter, at predetermined positions in the insulating member 30 are formed the holder holes 311 penetrating the through-thickness direction thereof, with the result that the insulating member 30 becomes the holder member 31. To form the holder holes 311, processing (such as etching or blanking, or processing using laser, electron beam, ion beam, wire electrical discharge) may be applied, similarly in forming the screw holes 322 or the like in the insulating member 30. FIG. 4-4 is a partial cross sectional view taken along line A-A shown in FIG. 3, showing the conductive contact holder 3 that is completed by forming the holder holes 311.

According to the method for manufacturing a conductive contact holder of the embodiment of the present invention, to manufacture a conductive contact holder that includes an insulating holder member for holding a plurality of conductive contacts that input and output a signal to and from a circuitry, and a substrate having a hollow portion to which the holder member can be fitted, the method includes: forming the substrate with a conductive material; fixing the substrate formed at the forming the substrate and the insulating member that is a raw material of the holder member by fitting the insulating member to the hollow portion provided in the substrate; polishing a surface of the holder member fixed at the fixing, and a surface of the substrate adjoining the surface so as to make the surfaces smooth; and forming a plurality of holder holes that penetrate the holder member, the surface of which is polished at the polishing a surface, and that respectively contain the conductive contacts. The fixing includes: filling an insulating adhesive between the holder member and the substrate; or applying either to an inner surface of the hollow portion before fitting the holder member or to a side surface facing the hollow portion of the holder member when fitting the holder member, or to the both surfaces. This realizes reduction in thickness while maintaining the strength, thereby achieving reduction in production time and cost.

According to the present embodiment, the conductive contact holder is formed by fastening the insulating member (raw material of the holder member) and the substrate, which are separately manufactured. This reduces the production time compared with a conductive contact holder formed as an integral unit, thereby enabling fast production and delivery of the products.

According to the present embodiment, after the insulating member is fastened to the substrate, the adjoining surfaces of the both members are polished to equalize the through thicknesses of the members and then the holder holes are formed. This allows the holder holes to be accurately formed, and is particularly preferable to form a small conductive contact holder for use in an LCD.

In addition, according to the present embodiment, connecting screw holes are provided on the substrate, and the substrate and the insulating member are fastened with the screws. This increases the strength of the screw thread, thereby increasing the clamping capacity of the screws and stabilizing the connection with the holder member. Further, good maintenance is provided because the screw threads are not easily damaged by repetitive attachment and detachment of the screws.

As described, according to the present embodiment, the high strength is ensured even when the conductive contact holder is made thin. Further, the durability of the conductive contacts is improved. This enables stable testing over a long period of time, without being affected by the dimensional change caused by the atmosphere during the testing or by change with time due to process deformation remained after the testing.

Although the foregoing specifically describes exemplary embodiment for carrying out the present invention, the present invention should not be limited to the embodiment. For example, the shape of the conductive contacts is only an example. Needless to say, the present invention is applicable to conductive contacts having other shapes.

Further, a film-like insulating layer may be formed by coating an insulating material such as a highly insulating synthetic resin on the surface of the substrate. To this end, processing method such as coating, colander, extrusion, dip, spray, spread, electrodeposition may be used. As the insulating layer, an insulating material of the same type of the insulating member constituting the holder member or of a different type may be used. The insulating layer may be formed by chemical vapor deposition, (CVD), sputtering, plating, or other processing methods. Further, the insulating layer may be an insulating film formed by an oxide film such as alumite.

The thickness (film thickness) of the insulating layer formed in a film as described is made to about one tenth the thickness of an insulating film formed by injection molding, insert molding, or the like. As a result, when forming conductive contact holders having the same plate thickness, the conductive material serving as a main body of the substrate can have a thickness greater than that of a related-art method by a thickness reduced by making the insulating film thinner. Thus, the strength of the conductive contact holder is increased.

In addition, the holder member may be formed by stacking two or more insulating materials. For example, when each of the needle members, provided on both ends of the conductive contacts, has a flange, the holder hole has a stepped shape with the diameter of both ends being smaller than the diameter of its center portion. In this arrangement, because the conductive contacts cannot be contained in the holder holes in downstream operations, it is preferable that the holder member include a plurality of stacked substrates.

The embodiment described above assumes that the conductive contact unit is used to test a semiconductor integrated circuit. In addition, the embodiment is applicable to a high-density probe unit used to test a package substrate or wafer level on which a semiconductor chip is mounted. In this case also, such advantages are achieved that the holder has high strength and its contact position accuracy is not deteriorated due to the change over time.

As is apparent from this, the present invention may include various embodiments that are not described herein, and various design changes or the like may be made within the scope of technical ideas specified by the patent claims.

As described above, a conductive contact holder manufactured by a method for manufacturing a conductive contact holder according to the present invention is preferably used for current testing of a circuitry such as an LCD.

The invention claimed is:

1. A method for manufacturing a conductive contact holder, comprising:
    forming, from a conductive material, a substrate having a hollow portion to which a holder member for holding a plurality of conductive contacts can be fitted;
    fixing the substrate formed from the conductive material and an insulating member by fitting the substrate and the insulating member into the hollow portion of the substrate, the insulating member being a raw material of the holder member;
    polishing a surface of the fixed holder member and a surface of the substrate adjoining the surface so as to make the surfaces smooth; and
    forming a plurality of holder holes for containing the conductive contacts, respectively, the holder holes penetrating the holder member, the surface of which is polished,
    wherein the fixing includes filling an insulating adhesive between the holder member and the substrate, or applying the adhesive either to an inner surface of the hollow portion before fitting the holder member or to a side surface facing the hollow portion of the holder member when fitting the holder member, or to the both surfaces.

2. The method for manufacturing a conductive contact holder according to claim 1, wherein the fixing includes fastening the holder member and the substrate with screws.

3. The method for manufacturing a conductive contact holder according to claim 1, wherein the forming the substrate includes forming an insulating layer on a surface of the substrate.

* * * * *